(12) United States Patent
Matsui et al.

(10) Patent No.: US 10,665,516 B2
(45) Date of Patent: May 26, 2020

(54) ETCHING METHOD AND PLASMA PROCESSING APPARATUS

(71) Applicant: HITACHI HIGH-TECHNOLOGIES CORPORATION, Minato-ku, Tokyo (JP)

(72) Inventors: Miyako Matsui, Tokyo (JP); Kenichi Kuwahara, Tokyo (JP); Naoki Yasui, Tokyo (JP); Masaru Izawa, Tokyo (JP); Tatehito Usui, Tokyo (JP); Takeshi Ohmori, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 15/690,660

(22) Filed: Aug. 30, 2017

(65) Prior Publication Data

US 2018/0269118 A1    Sep. 20, 2018

(30) Foreign Application Priority Data

Mar. 17, 2017 (JP) ................. 2017-052066

(51) Int. Cl.
| | |
|---|---|
| *H01L 21/67* | (2006.01) |
| *H01L 21/66* | (2006.01) |
| *H01L 21/3213* | (2006.01) |
| *H01L 21/311* | (2006.01) |
| *H01L 21/3065* | (2006.01) |

(Continued)

(52) U.S. Cl.
CPC .......... *H01L 22/26* (2013.01); *G01B 11/0625* (2013.01); *G01B 11/0675* (2013.01); *H01J 37/32082* (2013.01); *H01J 37/32449* (2013.01); *H01L 21/306* (2013.01); *H01L 21/31116* (2013.01); *H01L 21/31122* (2013.01); *H01L 21/31144* (2013.01); *H01L 21/32135* (2013.01); *H01L 21/67069* (2013.01);

(Continued)

(58) Field of Classification Search
None
See application file for complete search history.

(56) References Cited

U.S. PATENT DOCUMENTS

| | | | |
|---|---|---|---|
| 5,352,324 A | 10/1994 | Gotoh et al. | |
| 9,530,666 B2 | 12/2016 | Mizuno et al. | |

(Continued)

FOREIGN PATENT DOCUMENTS

| | | |
|---|---|---|
| JP | 2003-083720 A | 3/2003 |
| JP | 2005-294348 A | 10/2005 |

(Continued)

OTHER PUBLICATIONS

Korean Office Action dated Aug. 18, 2018 for Application No. 10-2017-0091300.

(Continued)

*Primary Examiner* — Stephanie P Duclair
(74) *Attorney, Agent, or Firm* — Miles & Stockbridge, P.C.

(57) ABSTRACT

The present invention relates to an etching method including a reaction layer forming step of forming a reaction layer by adsorption of a gas on a surface of an etching target material, a desorption step of desorbing the reaction layer after the reaction layer forming step, and a removal step of removing the reaction layer or a deposited film, characterized in that the surface of the etching target material is etched by the reaction layer forming step and the desorption step.

8 Claims, 10 Drawing Sheets

(51) Int. Cl.
*H01L 21/306* (2006.01)
*H01J 37/32* (2006.01)
*G01B 11/06* (2006.01)

(52) U.S. Cl.
CPC .. *H01L 21/67253* (2013.01); *H01J 2237/006* (2013.01); *H01J 2237/3347* (2013.01); *H01L 22/12* (2013.01)

(56) References Cited

U.S. PATENT DOCUMENTS

| | | |
|---|---|---|
| 2011/0139748 A1 | 6/2011 | Donnelly et al. |
| 2013/0023125 A1* | 1/2013 | Singh ............... H01L 21/3065 438/706 |
| 2015/0235861 A1 | 8/2015 | Mizuno et al. |
| 2016/0379841 A1 | 12/2016 | Hidaka et al. |

FOREIGN PATENT DOCUMENTS

| | | |
|---|---|---|
| JP | 2012-529777 A | 11/2012 |
| JP | 201711167 A | 1/2017 |
| KR | 10-2017-0000791 A | 1/2017 |
| WO | WO 2014/046083 A1 | 3/2014 |

OTHER PUBLICATIONS

Taiwanese Office Action dated Oct. 5, 2018 for Application No. 106125570.
Office Action dated Mar., 17, 2020 in corresponding Japanese Application No. 2017-052066.

* cited by examiner

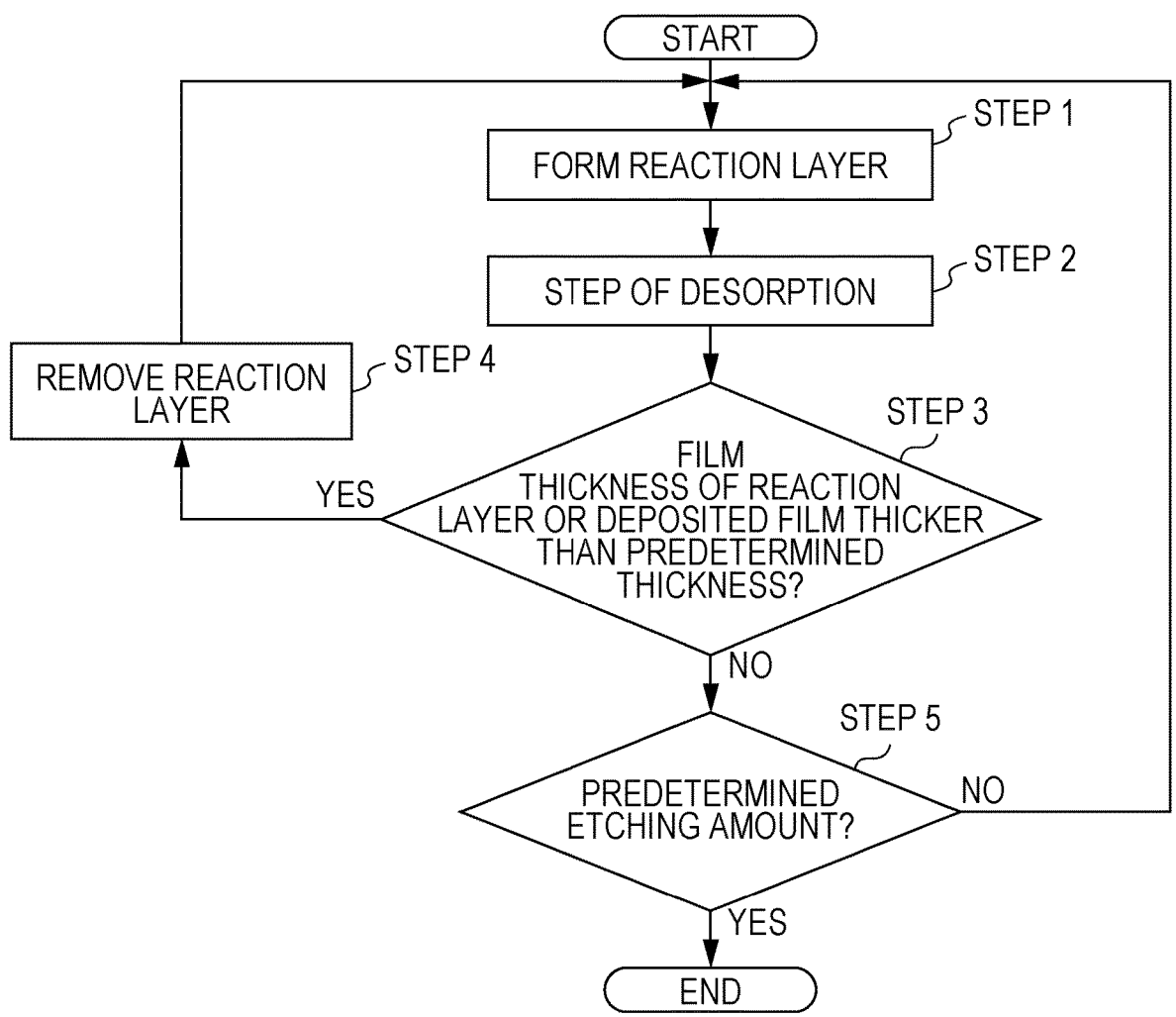

ETCHING METHOD AND PLASMA PROCESSING APPARATUS

BACKGROUND OF THE INVENTION

1. Field of the Invention

The present invention relates to an etching method and a plasma processing apparatus, and particularly to an etching method and a plasma processing apparatus suitable for plasma etching for controlling an excessive deposit film thickness on a pattern.

2. Description of the Related Art

Due to miniaturization of a functional element product such as a semiconductor element, reduction in thickness of a gate insulation film, an interlayer film, or the like constituting a device has advanced at the same time as increase in an aspect ratio. Furthermore, development of a three-dimensional device such as Fin-FET has been accelerated along with the miniaturization of a semiconductor device.

Along with this, in a step of etching a three-dimensional device, etching having a large aspect ratio of a groove pattern and a small pattern opening dimension is required. In addition, the thickness of an etching target film such as a mask, a gate insulating film, or an etch stopper has become thin, and highly selective etching is required. In addition, due to three-dimensionalization of a device, a step of etching a complicated shape has been increasing. Examples the step include a step of etching patterns formed in layers at different depths from a wafer surface simultaneously or a step of etching a pattern the opening dimension of which varies according to a depth.

In etching these patterns, in plasma etching for etching an oxide film made of Si, $SiO_2$, or the like and a nitride film made of $Si_3N_4$ or the like, a technique for etching an etching target material highly selectively and etching the material using a highly depositable gas such as a fluorocarbon gas or a hydrofluorocarbon gas in order to etch a fine hole or groove is known. However, for example, when a hole with a high aspect ratio is etched, an entrance portion of the hole is blocked with a reaction product as etching proceeds, and etching does not proceed disadvantageously.

As a technique for accurately processing an etching target material other than the above technique for etching a material using a highly depositable gas such as a fluorocarbon gas or a hydrofluorocarbon gas, JP 2012-529777 A discloses a high speed atomic layer etching (ALET) method including a step of disposing a substrate which can be etched in a plasma etching chamber, a step of forming a generation layer on a surface of the substrate, a step of removing a part of the generation layer by pulse-driving a plasma source, and a step of forming an etched substrate by repeating the step of forming a generation layer and the step of removing a part of the generation layer.

In addition, as for the above problem, WO2014/046083 discloses a plasma etching method characterized by including a first step of forming a hole in a processing target film formed on a substrate housed in a processing chamber by performing etching processing for etching the processing target film, and a second step of repeatedly performing a removal step of removing a reaction product attached to an entrance portion of the hole formed by performing the etching processing, a deposition step of depositing a deposit on a side wall portion of the hole from which the reaction product has been removed by the removal step, and an extension (deep etching) step of extending (deep etching) the hole in which the deposit has been deposited on the side wall portion by the deposition step by causing the etching processing to proceed.

SUMMARY OF THE INVENTION

However, accurate control of a deposited film thickness is required on a fine pattern and a pattern having a complicated shape along with complexity and miniaturization of a pattern in a three-dimensional device in recent years. For example, in a three-dimensional structure, as illustrated in FIG. 10A, in a case where a thick deposited film 4 is formed such that a mask 3 is not etched when a layer 2 formed of an etching target material formed on a wafer 1 is etched using the mask 3, as etching proceeds, an opening of the mask 3 is blocked by a reaction product, and processing cannot be performed so as to obtain a desired pattern disadvantageously.

As illustrated in FIGS. 10B and 10C, in a structure in which a first mask 5 and a second mask 6 are formed at different depths, in a case where the thick deposited film 4 is formed on the first mask 5 and the second mask 6 such that the first mask 5 and the second mask 6 are not etched when a second etching region 8 is etched using the second mask 6, as etching proceeds, an opening of the second mask 6 is blocked by a reaction product disadvantageously.

As illustrated in FIGS. 10B and 10C, in a structure in which the first mask 5 and the second mask 6 are formed at different depths, when the second etching region 8 is etched using the first mask 5 and the second mask 6, an etching target surface of the second etching region is not irradiated with ions due to the excessive reaction layer of the opening of the first mask and the excessive deposited film 4 of the opening of the second mask, and a desired shape cannot be obtained or etching stops disadvantageously.

As for these problems, when etching of a fine pattern having the structure illustrated in FIG. 10A is performed using the method disclosed in JP 2012-529777 A, adsorption and desorption are repeated on an etching target material, and etching proceeds, but a relatively thick reaction layer is formed on a mask or the like. Furthermore, a reaction product is reattached to an opening, and the opening thereby becomes narrow. Entry of ions to a pattern bottom may be hindered to make processing into a desired shape impossible, or the opening may be blocked to stop etching. In a case where a structure in which the first mask 5 and the second mask 6 are formed at different depths as illustrated in FIG. 10B, or a structure in which the first mask is different from the second mask in material is etched using the method disclosed in JP 2012-529777 A, an excessive deposited film may be formed in a portion where a step is generated, the thickness of a reaction layer on the first mask is different from that of the reaction layer on the second mask, or the deposited film thickness of the opening is asymmetrical. Therefore, the processed shape may be asymmetrical in a lateral direction, and a desired shape cannot be obtained.

In a case where a structure in which the first mask 5 and the second mask 6 are formed at different depths as illustrated in FIG. 10C, or a structure in which the first mask is different from the second mask in material is etched using the method disclosed in JP 2012-529777 A, an excessive reaction layer is formed in an opening, and a part of ions with which an etching target material is irradiated is thereby shielded. Therefore, a reaction layer adsorbed on the etching target material is not desorbed in a desorption step, and the reaction layer may remain unevenly on the etching target material. As a result, an etching target material cannot be accurately etched, and a desired shape cannot be realized.

In a case where a step of removing a reaction product at a hole opening and forming a side wall protective film is repeated as in the method disclosed in WO2014/046083, a mask material is scraped little by little every time the reaction product is removed, and a desired processed shape cannot be obtained. In the step of forming a side wall protective film, in a case where the depth or a mask material of a left side wall is different from that of a right side wall, a side wall protective film is not uniformly formed, and a desired processed shape cannot be obtained. Furthermore, even in a case where a symmetrical pattern in a lateral direction is processed, in processing of a fine pattern, an opening is narrow due to a small amount of a reaction product attached to a deposited film of the opening. Etching into a desired pattern shape may be impossible, or the opening may be blocked to stop etching.

For example, in a case of processing a pattern having a width of an opening of a level of 50 nm or less, it is necessary to control a deposited film thickness to a level of 20 nm or less. However, according to the method disclosed in WO2014/046083, the deposition rate of a deposited film thickness is as fast as 10 nm/sec, and it is difficult to accurately control the deposited film thickness to a level of 20 nm or less. Therefore, even if the etching method disclosed in WO2014/046083 is applied to the etching method disclosed in JP 2012-529777 A, etching problems for the structures of FIGS. 10A, 10B, and 10C, disclosed in JP 2012-529777 A cannot be solved.

In view of the above, an object of the present invention is to provide an etching method and a plasma processing apparatus for performing highly accurate etching in plasma etching for controlling an excessive deposited film thickness on a pattern.

The present invention relates to an etching method including a reaction layer forming step of forming a reaction layer by adsorption of a gas on a surface of an etching target material, a desorption step of desorbing the reaction layer after the reaction layer forming step, and a removal step of proving the reaction layer or a deposited film, characterized in that the surface of the etching target material is etched by the reaction layer forming step and the desorption step.

In addition, the present invention relates a plasma processing apparatus including a processing chamber for plasma-processing a sample containing an etching target material, a radio frequency power source for supplying radio frequency power for generating plasma, and a sample stage on which the sample is placed, further including a control unit for determining a wavelength signal increased in a reaction layer forming step and decreased in a desorption step in an interference spectrum obtained by monitoring a surface of the etching target material etched by the reaction layer forming step and the desorption step during the reaction layer forming step, and performing control to perform a removal step based on a difference between the obtained signal and the monitored signal, characterized in that the reaction layer forming step is a step of forming a reaction layer by adsorption of a gas on the surface of the etching target material, the desorption step is a step of desorbing the reaction layer after the reaction layer forming step, and the removal step is a step of removing the reaction layer or a deposited film.

According to the present invention, highly accurate etching can be performed in plasma etching for controlling an excessive deposited film thickness on a pattern.

BRIEF DESCRIPTION OF THE DRAWINGS

FIG. 5 is a process flow of an etching method according to an aspect of the present invention;

DESCRIPTION OF THE PREFERRED EMBODIMENTS

Figure 1:
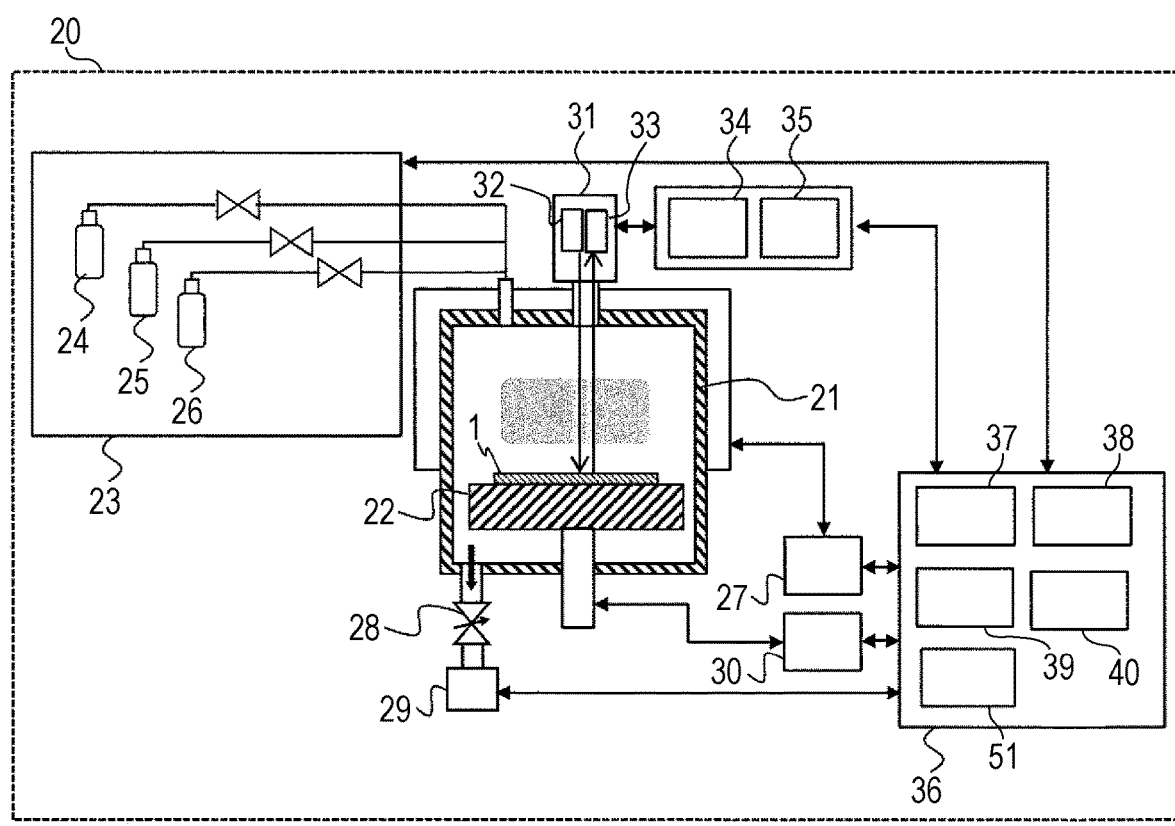
FIG. 1 is a diagram illustrating a configuration of a plasma etching apparatus according to an aspect of the present invention.

Hereinafter, an embodiment of the present invention will be described in detail with reference to the drawings. In all the drawings for describing the embodiment, the same components or the same members are denoted by the same reference numerals, and repeated description thereof is omitted.

Figure 2:
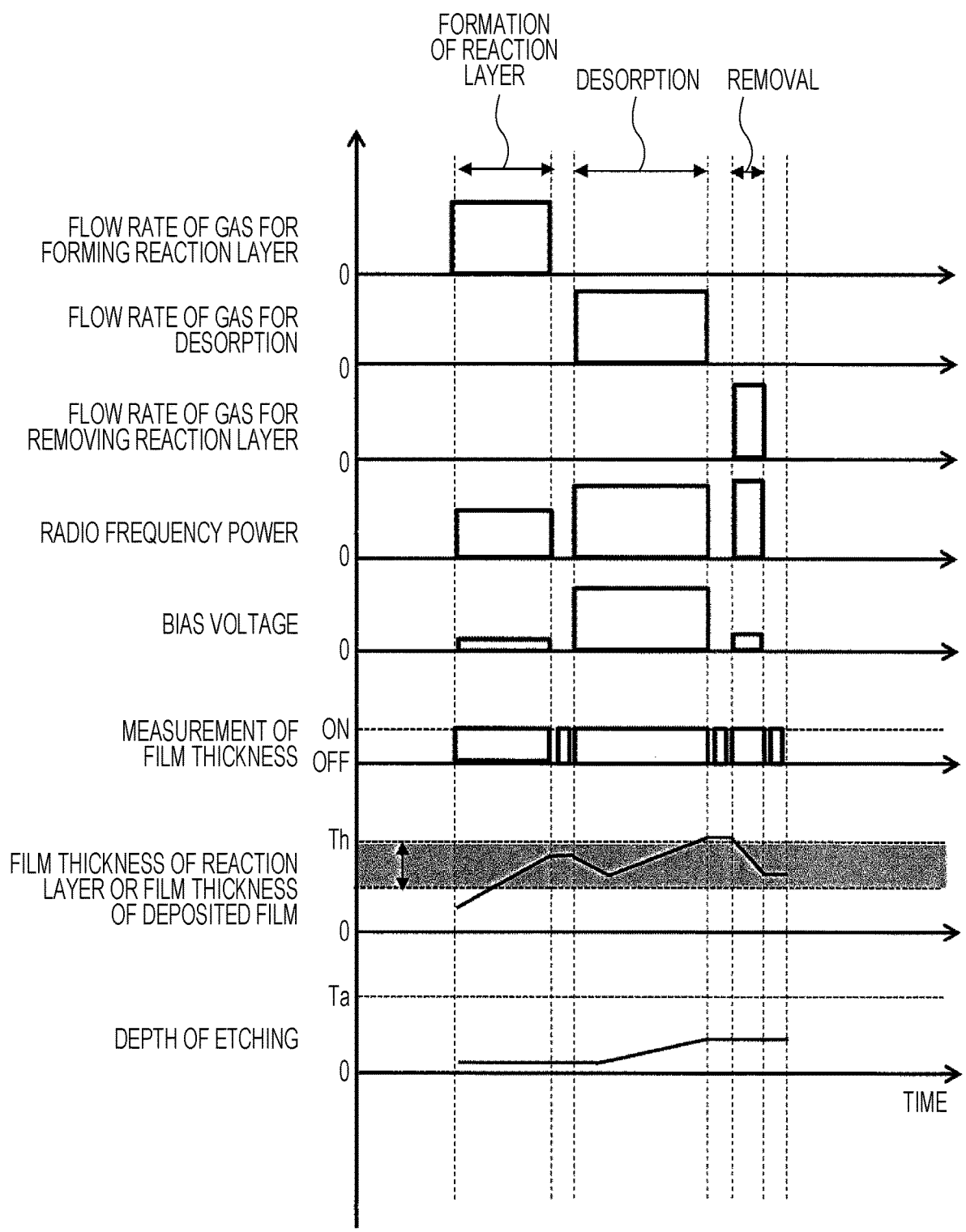
FIG. 2 is a diagram illustrating an etching sequence of an etching method according to an aspect of the present invention.

First, a plasma processing apparatus according to an aspect of the present invention will be described. FIG. 1 illustrates an example of a configuration of a plasma etching apparatus for performing an etching method according to an aspect of the present invention. FIG. 2 is a diagram illustrating an example of an etching sequence when plasma etching is performed in the plasma etching apparatus illustrated in FIG. 1.

As illustrated in FIG. 1, an etching apparatus 20 includes a wafer stage 22 which is a sample stage disposed in a processing chamber 21, and a gas supply unit 23 including a gas cylinder and a valve. A gas control unit 37 performs control such that a gas for forming a reaction layer 24, a gas for desorbing a reaction product 25, and a gas for removing a reaction layer 26 are supplied to the processing chamber 21 in each processing step. Plasma is generated in the processing chamber 21 by a gas supplied to the processing chamber 21 and radio frequency power supplied from a radio frequency power source 27 controlled by a radio frequency control unit 39. The pressure in the processing chamber 21 can be kept constant while a processing gas flows at a desired flow rate by a variable conductance valve 28 and a vacuum pump 29 controlled by an exhaust system control unit 38 and connected to the processing chamber 21.

The etching apparatus 20 includes a control unit 36, and the control unit 36 includes the gas control unit 37, the exhaust system control unit 38, the radio frequency control unit 39, a bias control unit 40, and a storage unit 51. The control unit 36 performs control relating to an etching flow illustrated in FIG. 5. For example, the control unit 36 performs an etching sequence as illustrated in FIG. 2. Furthermore, the control unit 36 controls a film thickness measuring apparatus 31, a light source 32, the spectroscope 33, a calculating unit 34, and a database 35.

Next, a flow of plasma etching in the etching apparatus 20 will be described.

As illustrated in FIG. 2, when a reaction layer forming step is initially started, the gas for forming a reaction layer 24 is supplied to the processing chamber 21 at a predetermined flow rate. The gas for forming a reaction layer 24 thus supplied is turned into plasma by radio frequency power to generate radicals, ions, and the like. The radicals and ions generated by the plasma reach a surface of the wafer 1 and form a reaction layer 9. The gas for forming a reaction layer 24 can be also adsorbed by an etching target material 2 as it is without generating plasma of a reactive gas.

Subsequently, when a desorption step is started, the gas for desorption 25 is supplied to the processing chamber 21 at a predetermined flow rate. The gas for desorption 25 thus supplied is converted into plasma by radio frequency power, and the surface of the wafer 1 is irradiated with ions and radicals generated by the plasma. At this time, in a case where a reaction product 12 generated by reacting the reaction layer 9 with the etching target material 2 is desorbed by ions 11 emitted from the plasma, ion energy can be controlled by applying a bias voltage supplied from a bias power supply 30 controlled by the bias control unit 40 to the wafer stage 22.

It is known that maximum ion energy in energy of the ions 11 with which the wafer is irradiated is approximately equal to the wafer bias voltage. Therefore, a maximum value of the ion energy can be controlled by adjusting the wafer bias voltage. The wafer stage 22 can further include a heating/cooling mechanism, and the reaction product 12 can be thermally desorbed by heating the wafer stage 22. Alternatively, the reaction product 12 can be thermally desorbed by heating the wafer stage 22 from an upper portion of the wafer 1 with a lamp or the like.

When an etched pattern is etched by repeating the above reaction layer forming step and desorption step, the excessive reaction layer 9 may be formed in a part of the etched pattern. If the excessive reaction layer 9 is formed, the reaction layer removal step is performed. When the reaction layer removal step is started, the gas for removing a reaction layer 26 is supplied to the processing chamber at a predetermined flow rate, and the gas for removing a reaction layer 26 thus supplied is converted into plasma by radio frequency power to generate radicals, ions, and the like. The gas for removing a reaction layer 26 is a gas capable of removing the reaction layer 9 formed in the reaction layer forming step and the reaction product 12 generated in the desorption step, and a gas having a low reactivity with a mask is used as the gas for removing a reaction layer 26.

The wafer bias voltage in the reaction layer removal step is obtained as follows based on a film thickness T of the excessive reaction layer 9 and a position where the excessive reaction layer is formed in an etched pattern. Here, a method for detecting that the excessive reaction layer 9 has been formed, determining a condition of the reaction layer removal step, and performing etching is exemplified.

In order to detect that the excessive reaction layer 9 has been formed, first, the film thickness of the reaction layer 9 on the etched pattern is measured. As illustrated in FIG. 1, the film thickness of the reaction layer 9 is measured by irradiating the wafer 1 with light from a light source 32 and measuring interference light reflected by the wafer 1 with the spectroscope 33. As for an etching depth of the etched pattern, for example, as disclosed in JP 2003-083720 A, a change in intensity of a specific wavelength is detected with a spectroscope, and a film thickness obtained by end point detection with an end point judging apparatus can be calculated. In a case of measuring the film thickness of the reaction layer, a change in intensity of a specific wavelength indicating a change in the film thickness 9 of the reaction layer is detected with the spectroscope 33, and the film thickness of the reaction layer 9 can be calculated by the calculating unit 34.

Figure 3A:
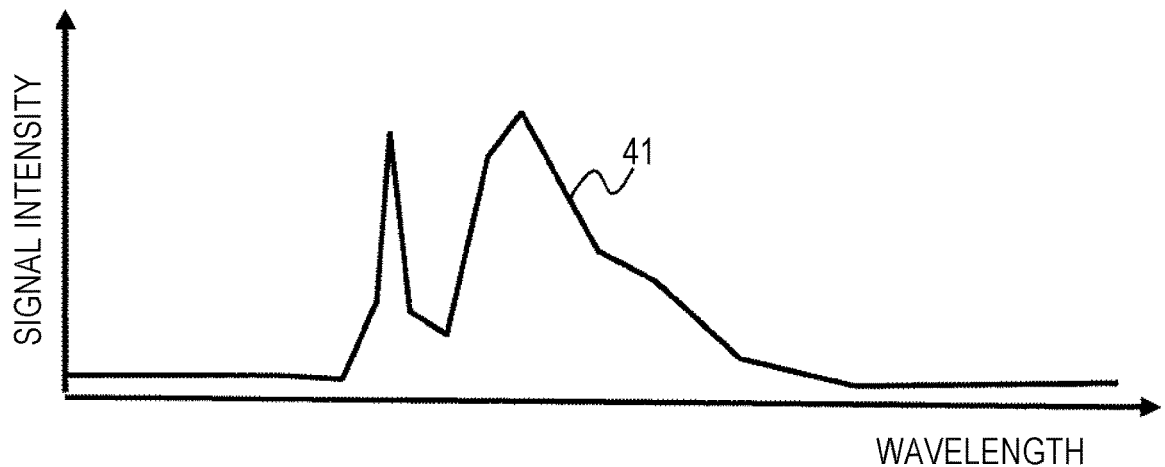
FIGS. 3A and 3B are diagrams illustrating an interference spectrum monitored by a spectroscope 33 and a signal waveform of a specific wavelength.
Figure 3B:
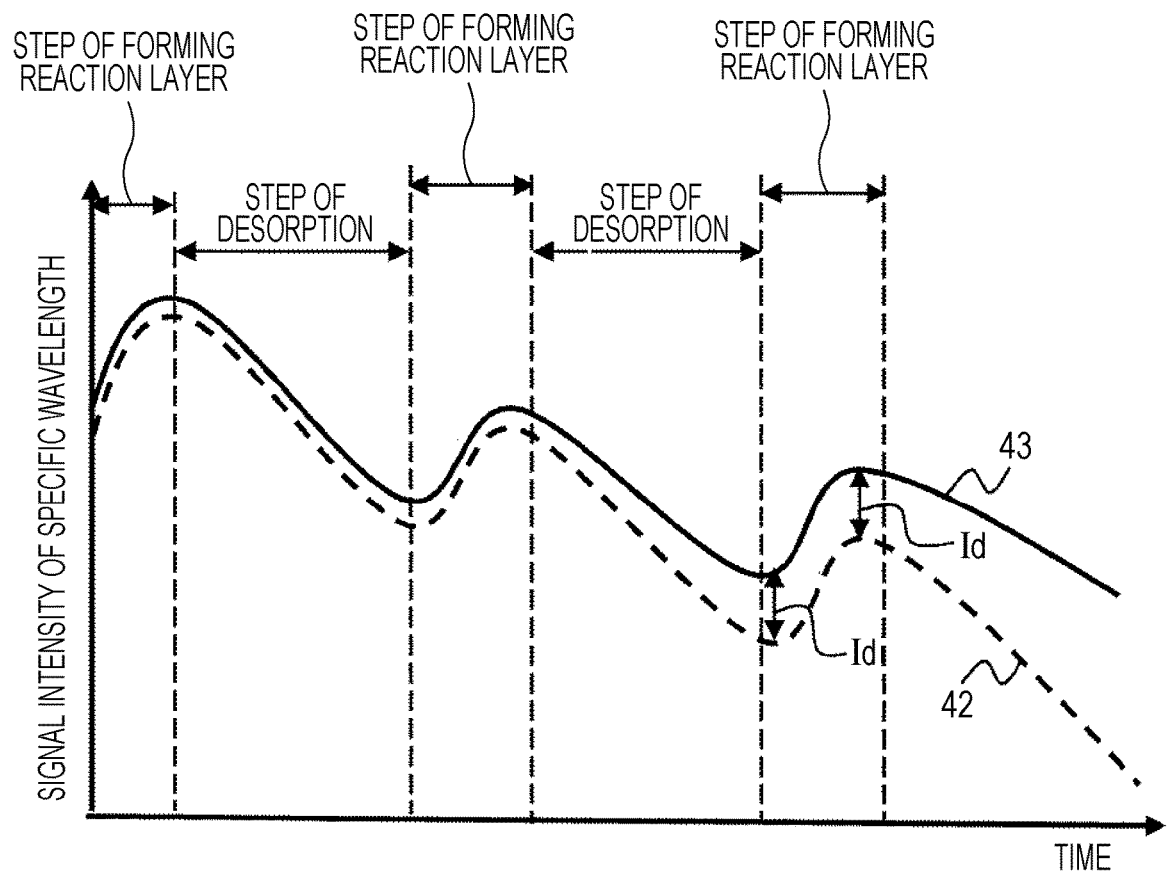

When the reaction layer forming step and the desorption step are performed in cycles, for example, an interference spectrum 41 as illustrated in FIG. 3A is measured in the spectroscope 33 included in the film thickness measuring apparatus 31. FIG. 3B illustrates a change with time in signal intensity of a specific wavelength including information on the reaction layer in the measured interference spectrum. The signal intensity of a specific wavelength indicates a tendency that the signal intensity of a specific wavelength is increased in the reaction layer forming step and the signal intensity of a specific wavelength is decreased in the desorption step.

In the reaction layer forming step, in a case where a change 42 of a reference signal intensity when a reaction layer having a film thickness within a range of allowable values is formed is acquired in advance and stored in the database 35, and a difference Id between the change 42 of a reference signal intensity and the measured signal intensity 43 exceeds a predetermined range, it can be determined that the excessive reaction layer 9 has been formed. Alternatively, the case where the excessive reaction layer 9 has been formed can be indirectly determined also by a fact that etching of an etched pattern does not proceed. Incidentally, by using several wavelengths including information on the reaction layer as a specific wavelength for measuring the film thickness of the reaction layer 9, a distribution of the film thickness of the reaction layer formed in the etched pattern can be measured.

Figure 4:
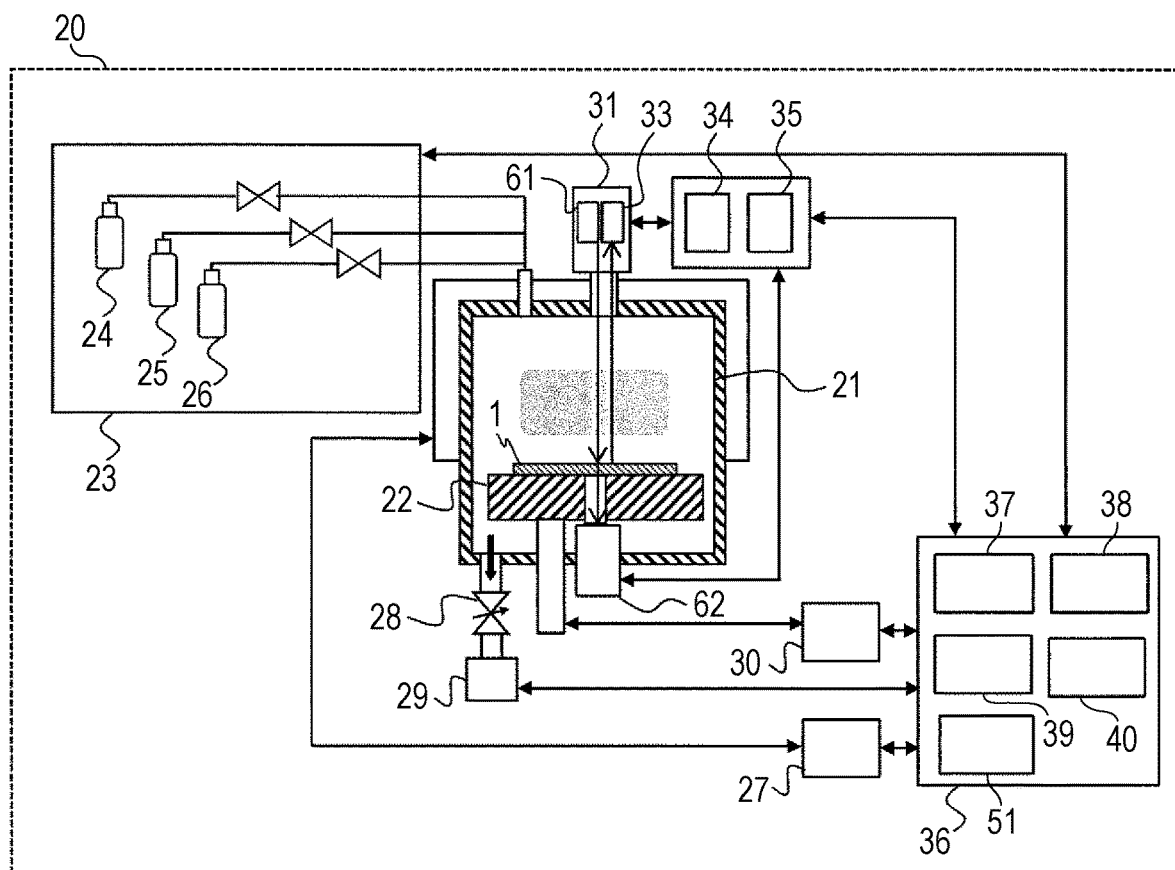
FIG. 4 is a diagram illustrating a configuration of a plasma etching apparatus according to an aspect of the present invention.

Measurement of the film thickness of the reaction layer may be performed during etching in all the steps, between the reaction layer formation step and the desorption step, between the desorption step and the reaction layer removal step, or between the reaction layer removal step and the reaction layer forming step. As a light source for measuring the film thickness, an external light source as illustrated in FIG. 1 may be used, or plasma light may be used. As another example of measuring the film thickness, as illustrated in FIG. 4, the film thickness of the reaction layer can be measured by irradiating an etched pattern with IR light from an IR light source 61 disposed on an upper portion of the wafer, and detecting an absorption spectrum of the IR light with a spectroscope 62 disposed on a lower portion of the wafer. The film thickness of the reaction layer can be also calculated by detecting a change in the signal intensity of a specific wavelength indicating a change in the film thickness of the reaction layer with the spectroscope 62.

Figure 6A:
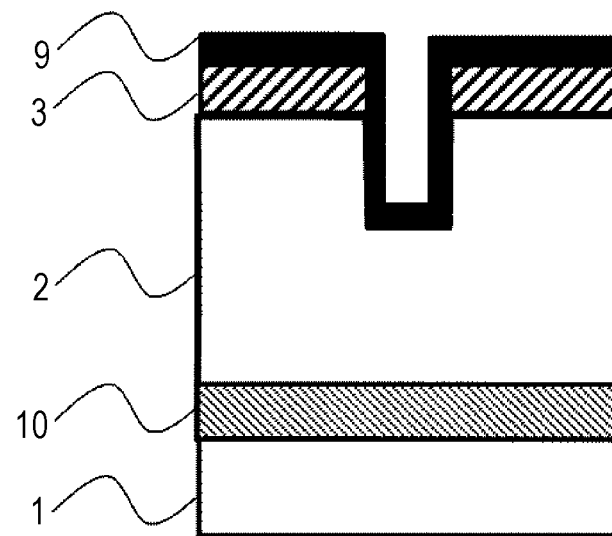
FIGS. 6A and 6B illustrate an example of a reaction layer forming step and a desorption step in an etching method according to an aspect of the present invention.
Figure 6B:
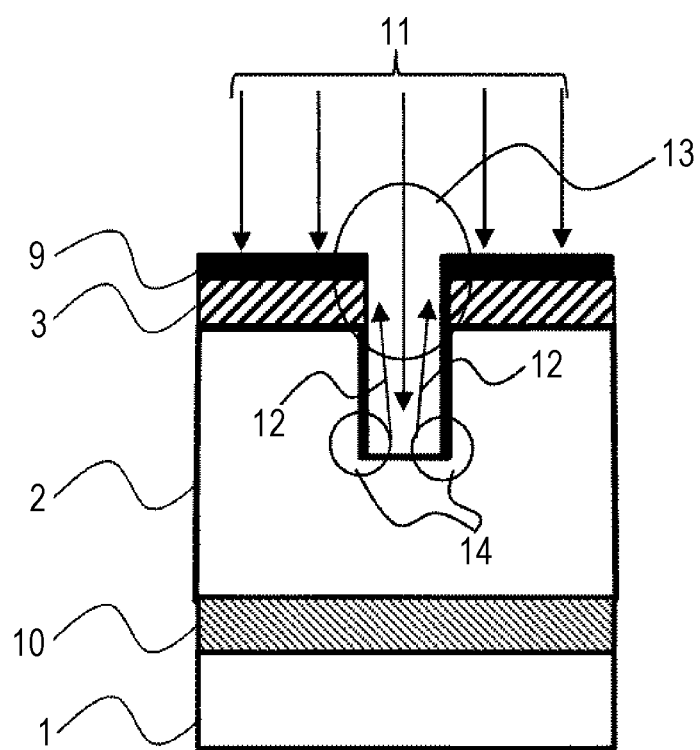
Figure 7A:
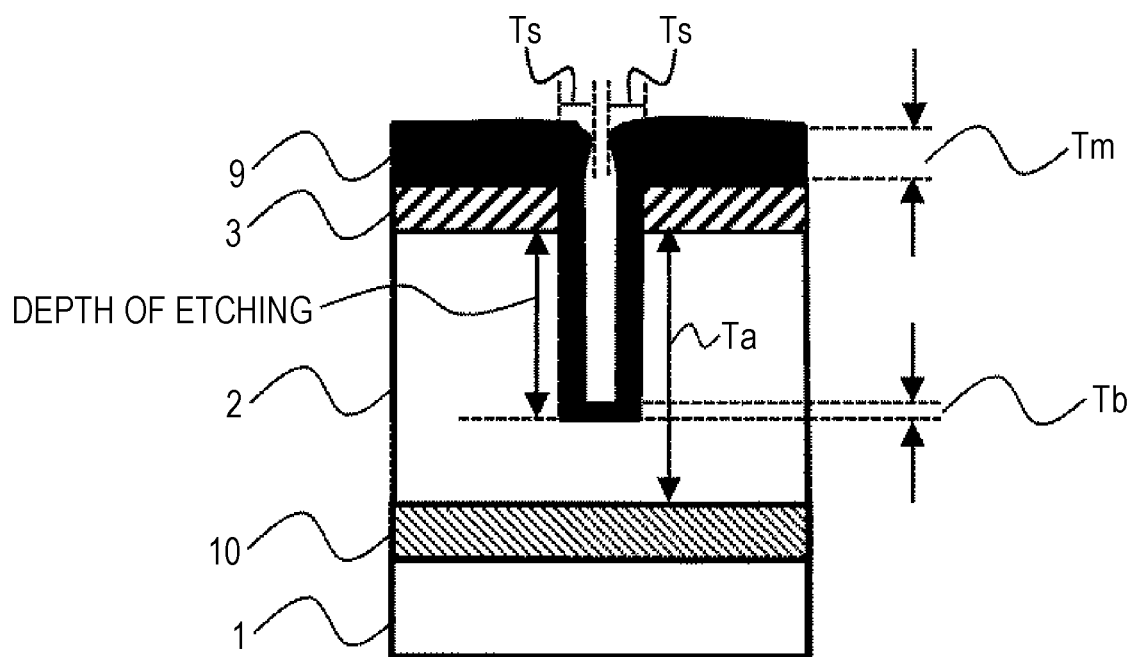
FIGS. 7A to 7B are cross-sectional views (1) of an etching shape before and after a removal step of an etching method according to an aspect of the present invention.
Figure 7B:
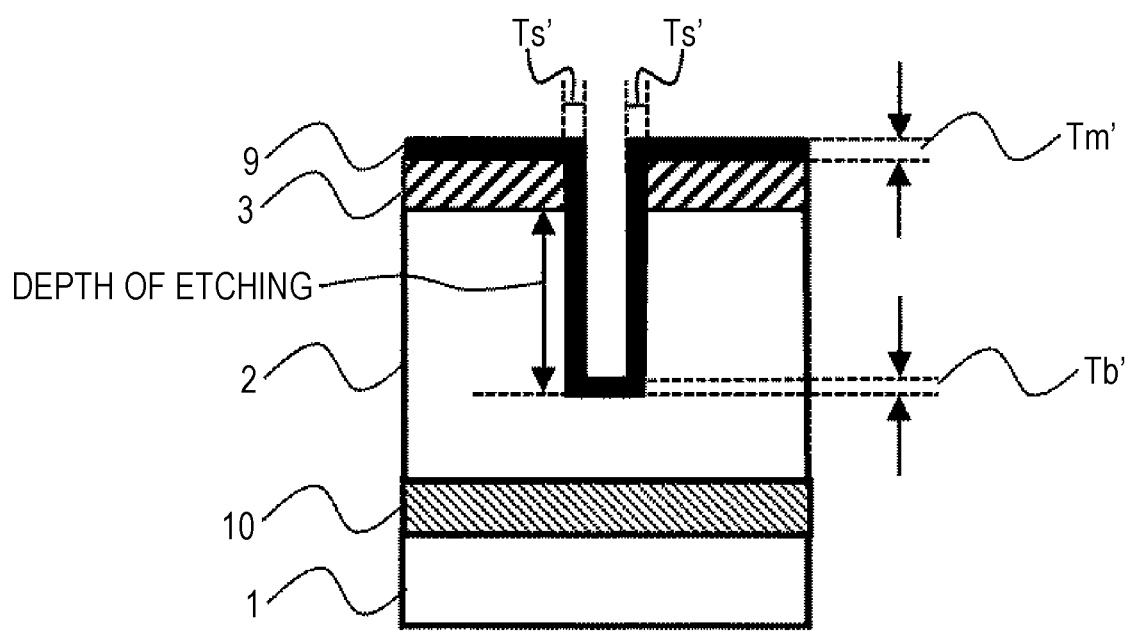

An example of the etching method according to an aspect of the present invention will be described with reference to FIGS. 5 to 7B. FIG. 5 is a process flow of an etching method according to an aspect of the present invention. FIG. 6A is a diagram for describing the reaction layer forming step (step 1 in FIG. 5). FIG. 6B is a diagram for describing the desorption step (step 2 in FIG. 5). FIG. 7A is a schematic cross-sectional view of an etching shape before the reaction layer removal step (step 4 in FIG. 5). FIG. 7B is a schematic cross-sectional view of an etching shape after the reaction layer removal step (step 4 in FIG. 5).

In the present example, as an example of an etched pattern, in a structure in which an etching target layer 10 and an interlayer film of the etching target material 2 are formed on the wafer 1 as a sample and a fine line pattern is formed on the mask 3, a case where the etching target material 2 as the interlayer film is etched will be described.

First, in step 1 (reaction layer forming step) of FIG. 5, as illustrated in FIG. 6A, a reactive gas, radicals, or an etchant reactive with the etching target material is supplied onto the wafer 1 on which a pattern including the etching target material 2 has been formed to form the reaction layer 9 on a surface of the etched pattern.

Subsequently, in step 2 (desorption step) of FIG. 5, the etched pattern is irradiated with ions generated by plasma or the like. As illustrated in FIG. 6B, on the surface of the etching target material 2, the reaction layer 9 reacts with the etching target material 2 by energy supplied from the ions, and the reaction product 12 is desorbed. In the present embodiment, the energy for desorbing the reaction product 12 is supplied by the energy of the ions 11 from the plasma. However, the energy for desorbing the reaction product 12 may be supplied by raising the wafer temperature by heating a lamp or the like.

Incidentally, in this desorption step, the reaction product 12 generated from the surface of the etching target material 2 or a component desorbed from the etching target material by ion sputtering or the like is reattached to an inside of the etched pattern, particularly to the vicinity of the opening 13 to make the opening 13 narrow or blocked. In addition, in a case where the aspect ratio of the surface of the etching target material 2 is high, the ions 11 do not sufficiently reach a side wall lower portion 14 in the desorption step, and the reaction layer 9 may partially remain after the desorption step. As a result, a reaction layer is deposited every cycle on the surface of the etching target material 2. Therefore, in the reaction layer forming step and the desorption step, the film thickness of the reaction layer and the film thickness of a component (deposited film) having the reaction product 12 reattached are monitored.

Subsequently, in step 3 of FIG. 5, it is determined whether the reaction layer 9 having an allowable value or more is formed on the surface of the etched pattern, or whether a deposited film having an allowable value or more is formed in the vicinity of the opening 13. For example, as illustrated in FIG. 7A, if it is determined that the reaction layer 9 thicker than the allowable value has been formed on the surface of the etched pattern, in step 4 of FIG. 5, as illustrated in FIG. 7B, the reaction layer removal step for removing the excessive reaction layer 9 is performed. Incidentally, the excessive reaction layer 9 contains the reaction layer formed in the reaction layer forming step, the component having the reaction product 12 reattached, and the component having the reaction layer 9 desorbed and reattached. After the reaction layer removal step, the reaction layer forming step (step 1 in FIG. 5) is performed.

In step 3 of FIG. 5, if it is determined that the reaction layer 9 having an allowable value or more is not formed on the surface of the etched pattern and that a deposited film having an allowable value or more is not formed in the vicinity of the opening 13, in step 5 of FIG. 5, it is determined whether the etching depth has reached a predetermined etching depth. If the etching depth has not reached the predetermined etching depth, the reaction layer forming step (step 1 in FIG. 5) is performed.

In step 5 of FIG. 5, if it is determined that the etching depth has reached the predetermined etching depth, the process flow of the etching method illustrated in FIG. 5 is ended. Incidentally, in step 5, instead of "predetermined etching depth", determination may be made based on the predetermined number of cycles of the reaction layer forming step and the desorption step. The predetermined number of cycles of the reaction layer forming step and the desorption step is the number of cycles at which a predetermined etching depth is obtained, determined in advance. In step 5 of FIG. 5, if it is determined that the etching depth has reached the predetermined etching depth, a step of removing a deposited films such as a reaction product is performed, and then a process of the etching method illustrated in FIG. 5 may be ended.

Next, a method for determining an etching processing condition in the reaction layer removal step from the film thickness of the formed reaction layer will be described. FIGS. 7A to 7B are diagrams illustrating a structure obtained by subjecting a structure in which the etching target layer 10 and an interlayer film of the etching target material 2 are formed on the wafer 1 as an etched pattern and a fine line pattern is formed as the mask 3 to the reaction layer removal step. If etching of the etching target material 2 proceeds by repeating the reaction layer forming step and the desorption step of the reaction layer 9 and each of a film thickness Ts of the reaction layer at the opening, a film thickness Tm of the reaction layer on the mask 3 or the like, and a reaction layer thickness Tb on the etching target material exceeds a predetermined allowable value, the reaction layer removal step is performed.

Examples of parameters of the etching processing condition in the reaction layer removal step include gas species, a gas flow rate, pressure, radio frequency power, wafer bias voltage, and processing time. However, for the gas species, the gas flow rate, the pressure, and the radio frequency, it is desirable to set recommended values in advance. The wafer bias voltage and the processing time can be also determined from the film thickness of the reaction layer 9 at the time when the film thickness of the reaction layer is monitored. The wafer bias voltage is set to a value within a range in which ions generated by plasma do not penetrate the reaction layer on the etching target material 2. This is for preventing the mask or the like from being etched in the reaction layer removal step.

The amount of the ions 11 incident on the mask at the same energy as the wafer bias voltage is set to a value smaller than the reaction layer thickness Tm on the mask. The wafer bias voltage is determined, and then the reaction layer is removed until the film thickness Ts of the reaction layer at the opening, the film thickness Tm of the reaction layer on the mask, and the reaction layer thickness Tb on the etching target material are within a predetermined range of allowable values. The removal rate of the reaction layer in the reaction layer removal step may be stored in advance in the storage unit 51 using a removal rate of the reaction layer or the like as a database, or may be measured again by measuring the film thickness of the reaction layer after the reaction layer removal step is performed for a predetermined time.

When the wafer bias voltage in the reaction layer removal step is determined as described above, the wafer bias voltage in the reaction layer removal step is set to a lower value than that in the desorption step. Incidentally, in a case of a simple pattern such as a line pattern, the wafer bias voltage may be set in advance to a sufficiently low value.

Figure 8A:
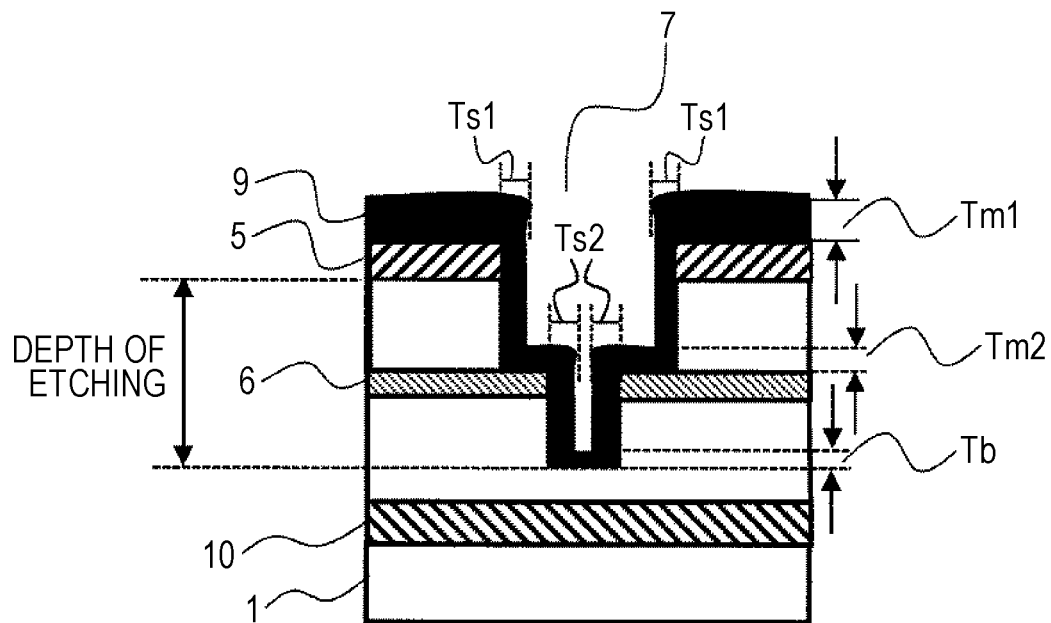
FIGS. 8A and 8B are cross-sectional views (2) of an etching shape before and after ae removal step of an etching method according to an aspect of the present invention.
Figure 8B:
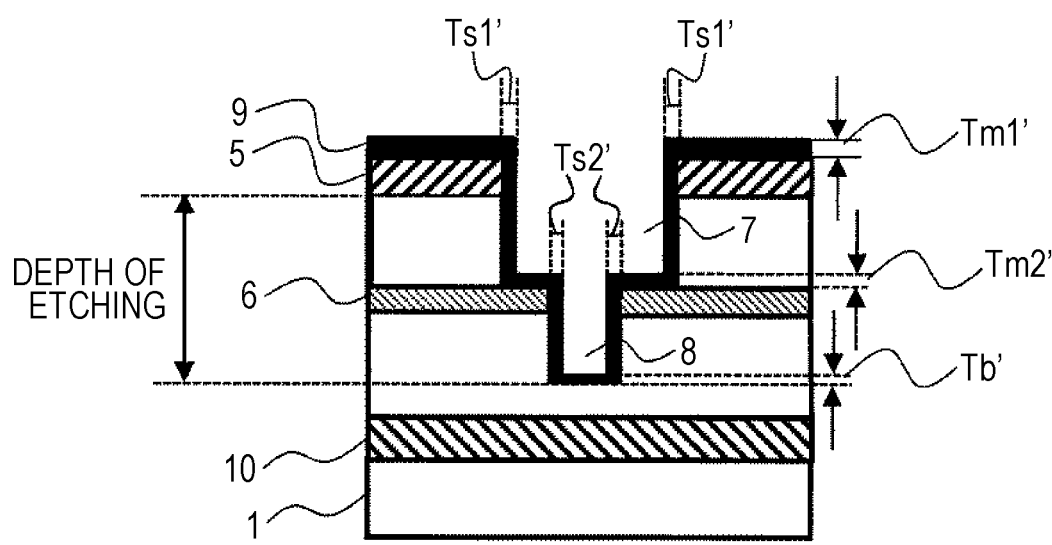

Next, as illustrated in FIGS. 8A and 8B, in a structure in which the etching target layer 10 is formed on the wafer 1 and the first mask 5 and the second mask 6 are formed in different layers, a method for etching a first etching region 7 using the first mask 5 and etching the second etching region 8 using the second mask 6 will be described. Incidentally, FIG. 8A is a cross-sectional view of an etching shape before the reaction layer removal step, and FIG. 8B is a cross-sectional view of an etching shape after the reaction layer removal step.

When etching of the etching region proceeds by repeating the reaction layer forming step and the desorption step, if any one of film thicknesses Ts1 and Ts2 of the reaction layer at the opening, film thicknesses Tm1 and Tm2 of the reaction layer on the mask, and the thickness Tb of the reaction layer on the etching target material exceeds a predetermined allowable value, the reaction layer removal step is performed. Particularly, the opening of the second mask 6 is narrower than the opening of the first mask 5, and therefore it is more important to control the film thicknesses Ts2 and Tm2 than the Ts1 and Tm1.

The wafer bias voltage and the processing time can be determined from the measured film thickness of the reaction layer at the time when the film thickness of the reaction layer is monitored. The wafer bias voltage is set to a value within a range in which ions generated by plasma do not penetrate the reaction layer formed on the first etching region 7 and the second etching region 8. The amount of the ions incident on the mask at the same energy as the wafer bias voltage is set to a value smaller than the reaction layer thicknesses Tm1 and Tm2 on the mask.

The wafer bias voltage is determined, and then the reaction layer is removed until all of the film thicknesses Ts1 and Ts2 of the reaction layer at the opening, the film thicknesses Tm1 and Tm2 of the reaction layer on the mask or the like, and the reaction layer thickness Tb on the etching target material are within a predetermined range of allowable values. Here, etching of the first etching region 7 using the first mask 5 is not necessarily etching by a cycle of the reaction layer forming step and the desorption step, but may be conventional etching.

Figure 9A:
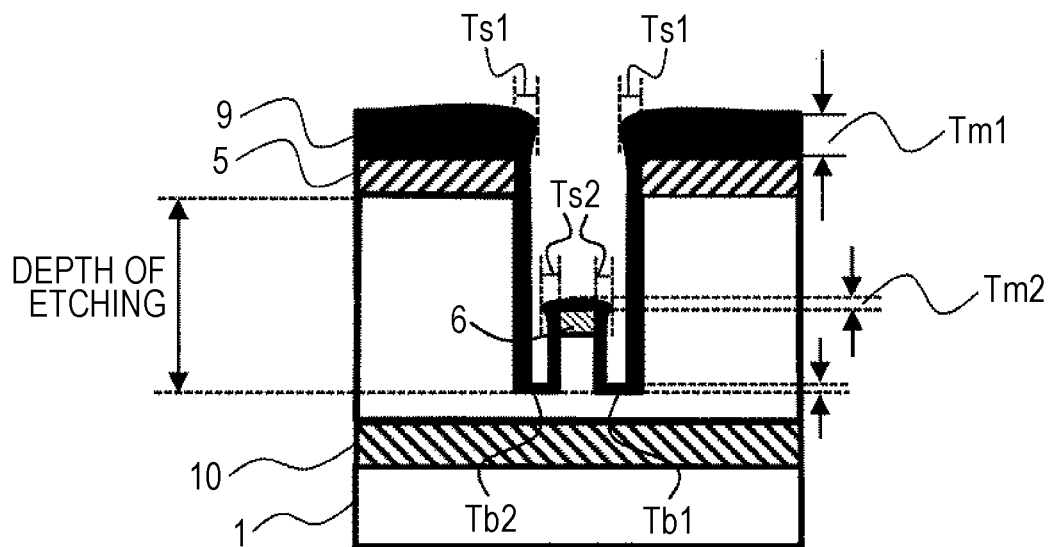
FIGS. 9A and 9B are cross-sectional views (3) of an etching shape before and after a removal step of an etching method according to an aspect of the present invention.
Figure 9B:
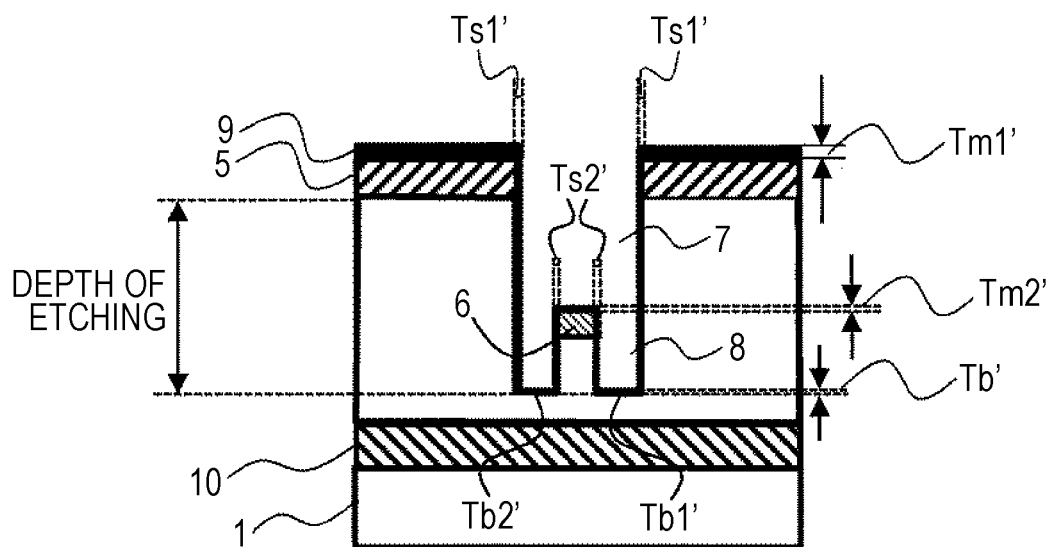
Figure 10A:
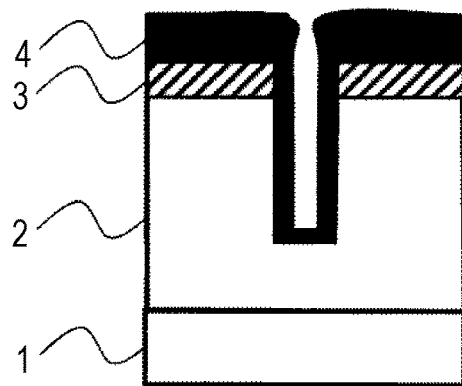
FIGS. 10A to 10C are diagrams illustrating a problem of a conventional etching method.
Figure 10B:
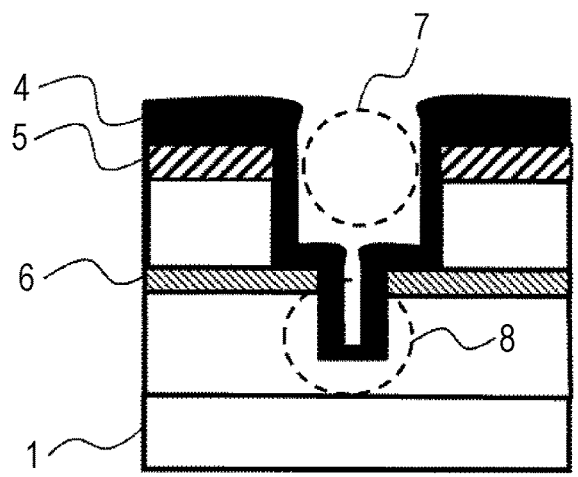
Figure 10C:
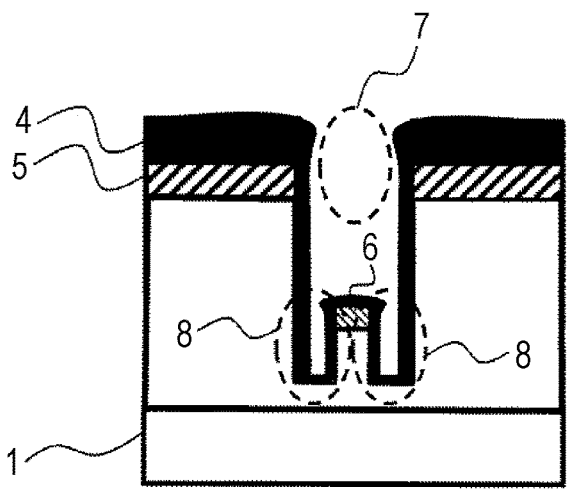

As illustrated in FIGS. 9A and 9B, in a structure in which the etching target layer 10 is formed on the wafer 1 and the first mask 5 and the second mask 6 are formed in different layers, a method for etching the first etching region 7 using the first mask 5 and etching the second etching region 8 using the second mask 6 will be described. Incidentally, FIG. 9A is a cross-sectional view of an etching shape before the reaction layer removal step, and FIG. 9B is a cross-sectional view of an etching shape after the reaction layer removal step.

When etching of the etching region proceeds by repeating the reaction layer forming step and the desorption step, if any one of the film thicknesses Ts1 and Ts2 of the reaction layer at the opening, the film thicknesses Tm1 and Tm2 of the reaction layer on the mask, and the thicknesses Tb1 and Tb2 of the reaction layer on the etching target material exceeds a predetermined allowable value, the reaction layer removal step is performed. In a case of the structure illustrated in FIGS. 9A and 9B, a facet of the second mask 6 is easily generated, and therefore it is necessary to remove the reaction layer in consideration of this facet.

The wafer bias voltage and the processing time can be determined from the measured film thickness of the reaction layer at the time when the film thickness of the reaction layer is monitored. The wafer bias voltage is set to a value within a range in which ions generated by plasma do not penetrate the reaction layer formed on the first etching region 7 and the second etching region 8. The amount of the ions incident on the mask at the same energy as the wafer bias voltage is set to a value smaller than the reaction layer thicknesses Tm1 and Tm2 on the mask.

The wafer bias voltage is determined, and then the reaction layer is removed until all of the film thicknesses Ts1 and Ts2 of the reaction layer at the opening, the film thicknesses Tm1 and Tm2 of the reaction layer on the mask or the like, and the reaction layer thicknesses Tb1 and Tb2 on the etching target material are within a predetermined range of allowable values. Here, etching of the first etching region 7 using the first mask 5 is not necessarily etching by a cycle of the reaction layer forming step and the desorption step, but may be conventional etching.

In addition, the etching method according to an aspect of the present invention can be performed similarly to the present example not only in the above structures illustrated in FIGS. 8A and 8B and FIGS. 9A and 9B but also in the structure of the etched pattern in which the mask and the etching target material are formed in three or more stages.

The type of a gas used in each of the above reaction layer forming step, desorption step, and reaction layer removal step is appropriately selected according to a material of an etching target film to be subjected to etching processing. For example, in a case where a mixed gas of a fluorocarbon gas and a first gas, a mixed gas of a hydrofluorocarbon gas and the first gas, or a mixed gas of a fluorocarbon gas, a hydrofluorocarbon gas, and the first gas is used as the gas for forming a reaction layer 24, for example, a mixed gas of a fluorocarbon gas and a second gas, a mixed gas of a hydrofluorocarbon gas and the second gas, or a mixed gas of a fluorocarbon gas, a hydrofluorocarbon gas, and the second gas is used as the gas for desorption 25, and for example, the second gas is used as the gas for removing a reaction layer 26.

For example, in a case where a mixed gas of a HBr gas and a third gas, a mixed gas of a $BCl_3$ gas and the third gas, or a mixed gas of a HBr gas, a $BCl_3$ gas, and the third gas is used as the gas for forming a reaction layer 24, for example, a mixed gas of a HBr gas and a fourth gas, a mixed gas of a $BCl_3$ gas and the fourth gas, or a mixed gas of a HBr gas, a $BCl_3$ gas, and the fourth gas mixed gas is used as the gas for desorption 25, and for example, the fourth gas is used as the gas for removing a reaction layer 26.

Incidentally, examples of the fluorocarbon gas include a $C_4F_8$ gas, a $C_5F_8$ gas, and a $C_4F_6$ gas. Examples of the hydrofluorocarbon gas include a $CHF_3$ gas, a $CH_2F_2$ gas, and a $CH_3F$ gas. Examples of the rare gas include a He gas, an Ar gas, a Ne gas, a Kr gas, and a Xe gas. The first gas is at least one of a rare gas, an $O_2$ gas, a $CO_2$ gas, and a $N_2$ gas. The second gas is at least one of a rare gas, an $O_2$ gas, a $CO_2$ gas, a $CF_4$ gas, a $N_2$ gas, a $H_2$ gas, an anhydrous HF gas, a $CH_4$ gas, a $CHF_3$ gas, and a $NF_3$ gas.

The third gas is at least one of a rare gas, a $Cl_2$ gas, an $O_2$ gas, a $CO_2$ gas, and a $N_2$ gas. The fourth gas is at least one of a rare gas, a $Cl_2$ gas, an $O_2$ gas, a $CO_2$ gas, a $CF_4$ gas, a $N_2$ gas, a $H_2$ gas, an anhydrous HF gas, a $CH_4$ gas, a $CHF_3$ gas, and a $NF_3$ gas.

As described above, according to the above plasma processing method according to an aspect of the present invention, even in a case where an optimum etching condition is gradually changed according to the number of wafers which have been subjected to etching, an etched pattern can be etched more accurately.

In addition, each of the above reaction layer forming step, desorption step, and reaction layer removal step has been described as processing using plasma. However, as the etching method according to an aspect of the present invention, each of the reaction layer forming step, desorption step, and reaction layer removal step is not necessarily processing using plasma. For example, in the reaction layer forming step, the gas for forming a reaction layer 24 may be adsorbed by the etching target material 2 without being converted into plasma, thereby forming the reaction layer. In the desorption step, the reaction product 12 may be thermally desorbed by heating the wafer stage 22 described below, or the reaction product 12 may be thermally desorbed by heating the wafer stage 22 from an upper portion of the wafer 1 with a lamp or the like. In the reaction layer removal step, the reaction layer 9 formed in the reaction layer forming step and the reaction product 12 generated in the desorption step may be removed by the gas for removing a reaction layer 26 not converted into plasma.

According to the present invention, it is possible to suppress excessive deposition of a reaction layer and to control a film thickness of the reaction layer at an atomic layer level in a fine pattern, a pattern having a mask at positions having a plurality of depths, a pattern having a mask made of a plurality of materials, a fine pattern having a three-dimensional structure, or the like. In addition, according to the present invention, it is possible to suppress an abnormal shape such as an etch stop or a tapered shape and to process a fine pattern of a three-dimensional structure accurately in a fine pattern, a pattern having a mask at positions having a plurality of depths, a pattern having a mask made of a plurality of materials, a fine pattern having a three-dimensional structure, or the like. Furthermore, also in a mass production process, it is possible to cope with a process change over time, and processing with high reproducibility and high accuracy can be performed.

As described above, the present invention is not limited to the present embodiment, but may be replaced with a configuration that is substantially the same, a configuration to exhibit the same operation and effect, or a configuration capable of achieving the same object as the configuration described in the above embodiment.

What is claimed is:

1. An etching method comprising:
a reaction layer forming step of forming a reaction layer by adsorption of a gas on a surface of an etching target material;
a desorption step of desorbing the reaction layer after the reaction layer forming step;
monitoring a thickness of the formed reaction layer; and
when the thickness of the formed reaction layer is greater than a predetermined amount, performing a removal step of removing the reaction layer remaining after the desorption step until a thickness of the formed reaction layer is within said predetermined amount,
wherein the surface of the etching target material is etched by the reaction layer forming step and the desorption step.

2. The etching method according to claim 1, wherein the monitoring a thickness is performed by an optical method.

3. The etching method according to claim 1, wherein
the reaction layer forming step, the desorption step, and the removing step are all performed using plasma, and radio frequency power supplied to a sample stage on which a sample containing the etching target material is placed in the removal step is smaller than radio frequency power supplied to the sample stage in the desorption step.

4. The etching method according to claim 3, wherein a gas used in the removal step is different from a gas used in the desorption step.

5. The etching method according to claim 1,
wherein said thickness is one or more of a thickness between opposing sides of an opening in at least one mask, a thickness of the formed reaction layer on said at least one mask, and a thickness of said formed reaction layer on said etching target material, and
wherein said removal step comprises removing the reaction layer remaining after the desorption step until one or more of said thickness between opposing sides of an opening in at least one mask, said thickness of the formed reaction layer on said at least one mask, and said thickness of said formed reaction layer on said etching target material is within said predetermined amount.

6. The etching method according to claim 5,
wherein said at least one mask comprises a first and a second mask,
wherein said thickness is one or more of a thickness between opposing sides of an opening in said first mask, a thickness between opposing sides of an opening in said second mask, a thickness of the formed reaction layer on said first mask, a thickness of the formed reaction layer on said second mask, and said thickness of said formed reaction layer on said etching target material, and
wherein said removal step comprises removing the reaction layer remaining after the desorption step until one or more of said thickness between opposing sides of said opening in said first mask, said thickness between opposing sides of said opening in said second mask, said thickness of the formed reaction layer on said first mask, said thickness of the formed reaction layer on said second mask, and said thickness of said formed reaction layer on said etching target material is within said predetermined amount.

7. An etching method comprising:
a reaction layer forming step of forming a reaction layer by adsorption of a gas on a surface of an etching target material;
a desorption step of desorbing the reaction layer after the reaction layer forming step; and
a removal step of removing a deposited film,
wherein the surface of the etching target material is etched by the reaction layer forming step and the desorption step, and
wherein the removal step is performed in a case where the thickness of the deposited film is monitored by an optical method and the monitored thickness of the deposited film is thicker than a predetermined amount.

8. An etching method comprising:
a reaction layer forming step of forming a reaction layer by adsorption of a gas on a surface of an etching target material;
a desorption step of desorbing the reaction layer after the reaction layer forming step;
monitoring a thickness of a deposited film; and
when the thickness of the deposited film is greater than a predetermined amount, performing a removal step of removing the deposited film until a thickness of the deposited film is within said predetermined amount,
wherein the surface of the etching target material is etched by the reaction layer forming step and the desorption step.

* * * * *